United States Patent
Chuang et al.

(10) Patent No.: US 6,448,830 B1
(45) Date of Patent: Sep. 10, 2002

(54) SINGLE-STAGE TRI-STATE SCHMITT TRIGGER

(75) Inventors: Ching-Te Kent Chuang, South Salem, NY (US); Jente Benedict Kuang, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/007,854

(22) Filed: Nov. 5, 2001

(51) Int. Cl.[7] .............................................. H03K 3/037
(52) U.S. Cl. ...................................... 327/205; 327/205
(58) Field of Search ................................. 327/185, 205, 327/206, 208, 210–214, 219, 223

(56) References Cited

U.S. PATENT DOCUMENTS

| | | | |
|---|---|---|---|
| 4,539,489 A | | 9/1985 | Vaughn |
| 5,341,033 A | * | 8/1994 | Koker .......................... 327/206 |
| 5,886,556 A | * | 3/1999 | Ganger et al. ............... 327/199 |
| 5,945,859 A | * | 8/1999 | Pang ........................... 327/206 |
| 6,046,617 A | | 4/2000 | Hoeld |
| 6,060,925 A | * | 5/2000 | Chou .......................... 327/205 |
| 6,127,898 A | * | 10/2000 | Naura .......................... 326/31 |

OTHER PUBLICATIONS

IBM Corporation, "PD/SOI CMOS Schmitt Trigger Circuits with Controllable Hysteresis", J.B. Kuang and C.T. Chuang, p. 1–4.

* cited by examiner

Primary Examiner—My-Trang Nu Ton
(74) Attorney, Agent, or Firm—Bracewell & Patterson LLP

(57) ABSTRACT

A tri-state Schmitt trigger inverting device having multiple tri-state controller switching devices between a conventional voltage mode Schmitt trigger its voltage supply rails. When an enabling signal to the tri-state controller switching devices is set to a first level, the tri-state Schmitt trigger functions as a standard logic inverter. When a complementary enabling signal is received at the tri-state controller switching devices, the connections to the high voltage rail and low voltage rail of the tri-state Schmitt trigger are turned off, and the output of the tri-state Schmitt trigger is a high impedance. Thus, the device is a single stage tri-state Schmitt inverter having optimal hysteresis characteristics with minimal power consumption.

11 Claims, 3 Drawing Sheets

| Vi | En | $\overline{En}$ | Output | TP1 | P1 | P2 | P3 | TN2 | TN1 | N1 | N2 | N3 | TP2 |
|---|---|---|---|---|---|---|---|---|---|---|---|---|---|
| L | H | L | $V_H$ | O | O | O | X | O | O | X | X | O | O |
| L | L | H | $R_{HI}$ | X | O | O | X | X | X | X | X | O | X |
| H | H | L | $V_L$ | O | X | X | O | O | O | O | O | X | O |
| H | L | H | $R_{HI}$ | X | X | X | X | X | X | O | O | X | X |

L, $V_L$ = Low Logic Voltage
H, $V_H$ = High Logic Voltage
$R_{HI}$ = High Impedence
O = On
X = Off

*Fig. 4*

SINGLE-STAGE TRI-STATE SCHMITT TRIGGER

BACKGROUND OF THE INVENTION

1. Technical Field

The present invention relates in general to the field of digital logic inverters, and in particular, to Schmitt trigger inverters. Still more particularly, the present invention relates to a tri-state single-stage Schmitt trigger inverter capable of selectively producing an output of a logical high voltage, a logical low voltage, or a high impedance state.

2. Description of the Related Art

Voltage mode Complementary Metal Oxide Semiconductor (CMOS) Schmitt triggers are used in Very Large Scale Integrated (VLSI) circuit applications to provide hysteresis to the transfer characteristics of a circuit. They restore signal integrity in designs where increased noises from line-to-line capacitance coupling and other noise are present. Schmitt triggers can function as interface receivers, level shifters, wave form reshaping circuits, or simply delay elements. Further Schmitt triggers are often used to transform a signal with a slow or "sloppy" transition into a signal with a sharp transition.

SUMMARY OF THE INVENTION

Often, it is desirable for a Schmitt trigger to simultaneously realize the level-sensitive hysteresis characteristics of a conventional voltage mode Schmitt trigger while also having tri-state output capability. That is, the output may need to be at a logical high voltage, at a logical low voltage, or in a high impedance. For example, an output from a second device may be tied to the voltage output of the Schmitt trigger. If the output of the Schmitt trigger is desired to be electrically isolated, then the output should be in a high impedance state, allowing the second output to define the combined output of the two devices. It would be preferably for such a tri-state Schmitt trigger to be within one circuit stage to accommodate signal inversion logic requirements, performance requirements, requirements to have one less level of signal inversion in a critical timing path, or power considerations for avoiding unnecessary switching activities and reduced transitional power consumption when data need not be passed through.

The present invention addresses a need for a Schmitt trigger having three outputs states with the above described characteristics. In its preferred embodiment, the present invention is a tri-state Schmitt trigger inverting circuit having multiple tri-state controller switching devices connected to either a high voltage rail or a low voltage rail. When the enabling signal to the tri-state controller switching devices is set to a first level, the Schmitt trigger functions as a standard logic inverter. When the complementary enabling signal is received at the tri-state controller switching devices, the connections to the high voltage rail and low voltage rail of the Schmitt trigger are turned off, and the output of the Schmitt trigger is in a high impedance state. In the preferred embodiment, the device is a single stage tri-state Schmitt inverter having optimal hysteresis characteristics consistent with those of a conventional voltage mode Schmitt trigger, while having a tri-state output with minimal power consumption. The preferred embodiment of the invention has no more than three switching devices between the voltage output and a high or low voltage rail. Further, when the inventive tri-state Schmitt trigger is in a state where the output is in a high impedance state, unnecessary switching activities in the switching devices are eliminated.

The above, as well as additional objectives, features, and advantages in the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when running in conjunction with the accompanying drawings, wherein:

FIG. 4 is a table showing the on and off states for switching devices in the inventive circuit with various permutations of the input voltage and an enabling signal to the tri-state controller switching devices.

DETAILED DESCRIPTION OF THE PREFERRED EMBODIMENT

Figure 1:
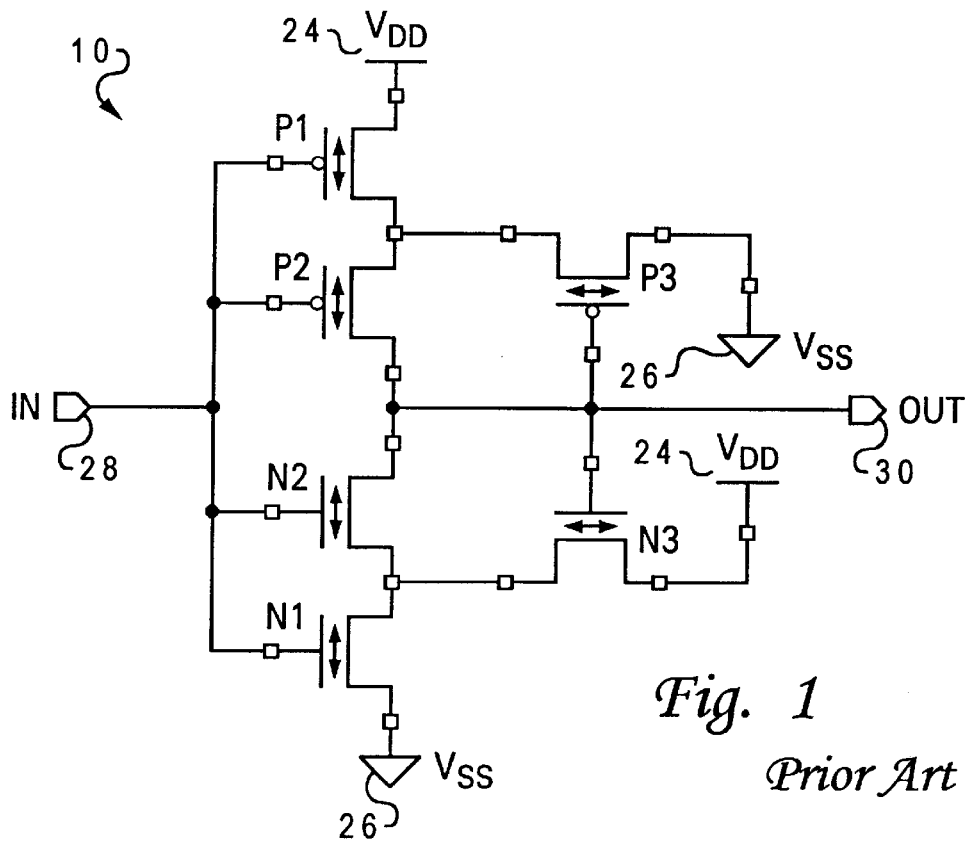
FIG. 1 is a schematic drawing of a conventional voltage mode Schmitt trigger logic inverter.

Referring to the drawings and in particular FIG. 1, there is depicted a schematic diagram of a conventional voltage mode Schmitt trigger 10 using CMOS technology. Conventional voltage mode Schmitt trigger 10 as depicted includes four Metal Oxide Semiconductor (MOS) transistors connected in series with the common gate connection forming the input into the circuit. In this example, all transistors are either P-channel Field Effect Transistors (P-FET) or N-channel Field Effect Transistors (N-FET). A P-FET P1 and a P-FET P2 are connected in series, with the source of P-FET P1 connected to a voltage supply $V_{DD}$, and the source of P-FET P2 is connected to the drain of P-FET P1.

The node between P-FET P2 and N-FET N2 provides a circuit output 30. The source of N-FET N2 is connected to the drain of N-FET N1, with the source of N-FET N1 being connected to the circuit common ground. The circuit output is also connected to the common gates of a P-FET P3 and N-FET N3. P-FET P3 has its drain connected to the circuit common ground and its source is connected to the drain of P-FET P1 and the source of P-FET P2. N-FET N3 has its drain connected to the supply voltage rail $V_{DD}$ and its source connected to the source of N-FET N2 and the drain of N-FET N1.

Figure 2:
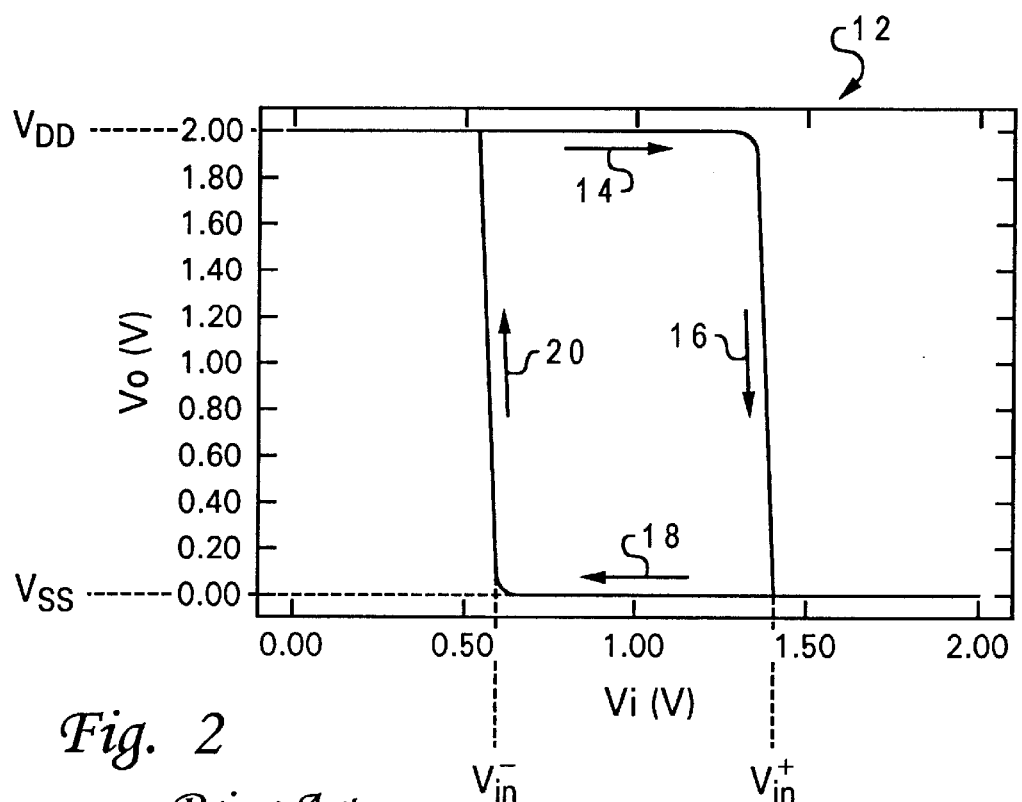
FIG. 2 is a voltage transfer curve showing the hysteresis characteristics of both the Schmitt trigger seen in FIG. 1 as well as the inventive tri-state Schmitt trigger.

FIG. 2 is a diagram showing an idealized transfer function characteristic curve 12 of conventional voltage mode Schmitt trigger 10 shown in FIG. 1. The input threshold voltage of Conventional voltage mode Schmitt trigger 10, the point at which the input voltage $V_i$ is equal to the output voltage $V_o$, is a function of the state of the output as seen from curve 12. The circuit threshold voltage of conventional voltage mode Schmitt trigger 10 is distinguished from the threshold voltage of the individual transistors, that being defined as the gate-source voltage necessary to cause the transistor to conduct some minimal current for a particular drain-source voltage.

For example, when $V_i$ is at a low logical voltage level ($V_{SS}$) near common ground and is increased to a high logical voltage, and the output of voltage $V_o$ is initially at a high logical level approaching $V_{DD}$, an N-FET N2 and an N-FET N1 will be turned off and an N-FET N3 is at the threshold of conduction. The source node of N-FET N3 is at $V_{DD}-V_T$, where $V_T$ is the threshold voltage of N-FET N3. Further, P-FET P1 and P-FET P2 will be on and P-FET P3 will be off. As the input $V_i$ increases in voltage, the gate-source voltage of N-FET N1 increases until the threshold voltage of N-FET N1 is reached, at which point current starts flow through N-FET N1, pulling down the source node of N-FET N2. As the input $V_i$ continues to increase, the gate-to-source voltage of N-FET N2 increases, and N-FET N2 starts conducting when its gate-to-source voltage becomes larger than its threshold voltage, thus pulling down the output node. Arrow 16 of FIG. 2 indicates that portion of curve 12 that pertains to these conditions once $V_i$ has reached the threshold voltage $V_{in}$ in of the circuit.

At the same time, P-FET P1 and P-FET P2 will start to turn off. N-FET N3 will also begin to turn off and P-FET P3 will begin to turn on as the output voltage decreases. As indicated by arrow 16 in FIG. 2, the output $V_{out}$ then drops to low voltage ($V_{SS}$). P-FET P2 will then turn on to pull up output 30. As indicated by arrow 20 of FIG. 2, the output voltage $V_o$ will switch back to a high state at or near $V_{DD}$.

One of the properties of conventional voltage mode Schmitt trigger 10 is increased immunity to noise on the input $V_i$. For example, when input $V_i$ has increased to a voltage point $V^+_{in}$ so that the output has changed to a low state ($V_{SS}$), noise on the input may cause $V_i$ to momentarily drop back below $V^+_{in}$. However, there will be no change in output $V_o$ unless the noise is sufficiently great to cause the input to drop below $_{in}V^-$. Thus, P-FET P3 may be referenced as a first threshold adjustment switching device and N-FET N3 as a second threshold adjustment switching device according to their function as described above.

Figure 3:
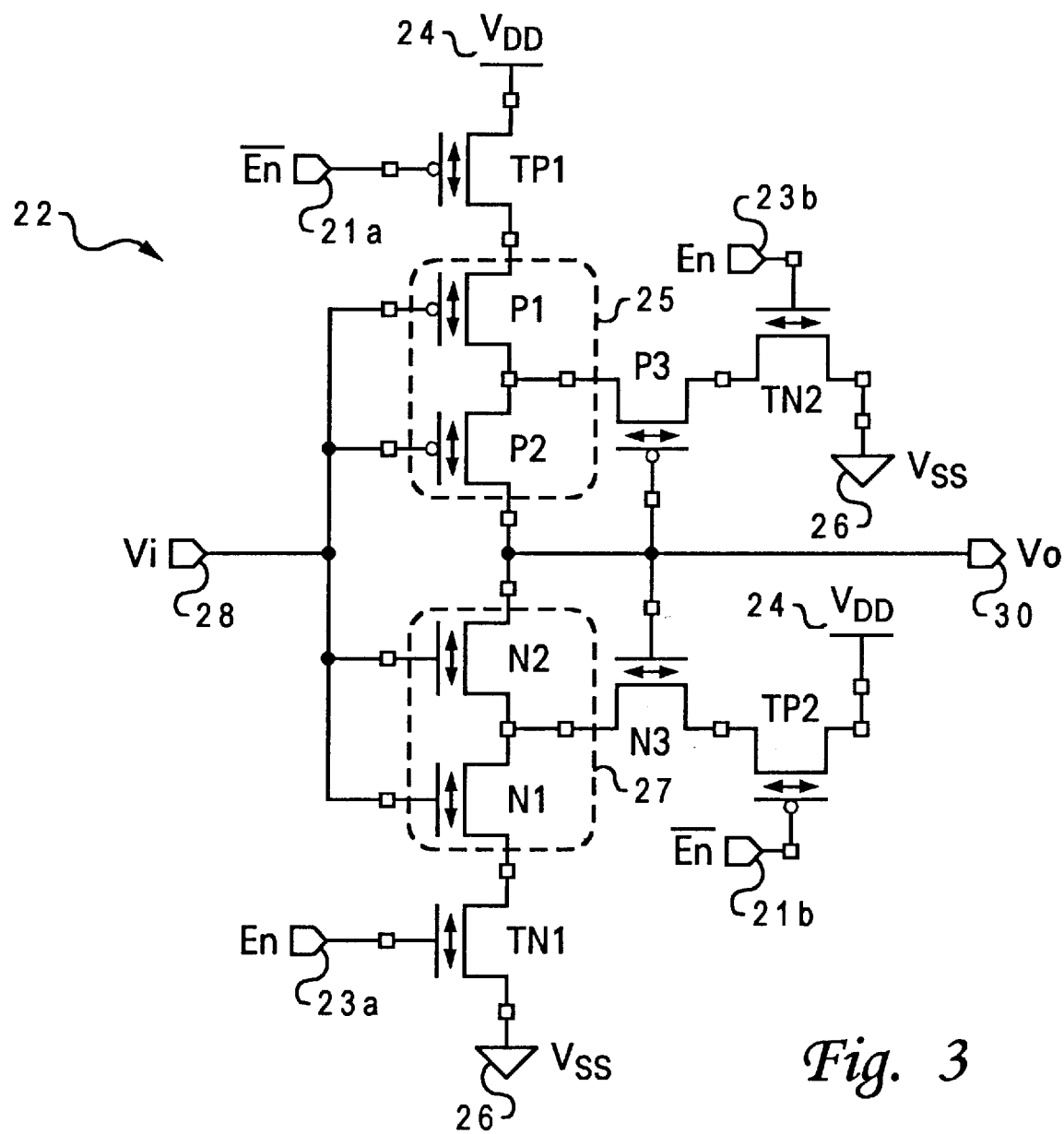
FIG. 3 is a schematic drawing of a tri-state Schmitt trigger circuit in accordance with a preferred embodiment of the present invention.

With reference now to FIG. 3, there is depicted a schematic diagram of the inventive tri-state Schmitt trigger 22 in a preferred embodiment according to the present invention, utilizing the conventional voltage mode Schmitt trigger 10 illustrated in FIG. 1. It is understood that all transistor devices depicted in FIG. 3 and subsequent figures of the disclosure are to be considered as switching devices depicted in FIG. 3 and subsequent figures embodiment these devices are depicted as N-FET and P-FET devices, their functions may be performed by analogous electrical devices such as bi-polar junction transistors (BJT), vacuum tube amplifiers, and other similar such devices.

A first voltage rail 24, which is a logical high voltage source $V_{DD}$ is connected to a first tri-state controller P-FET TP1 as depicted. The gate of first tri-state controller TP1 is connected to input 21a to receive a signal $\overline{En}$. As readily understood by those skilled in the art, $\overline{En}$ is the complementary signal of a signal $\overline{En}$. When $\overline{En}$ is logically high, tri-state Schmitt trigger 22 is enabled to function as a Schmitt trigger inverter for inverting a logic signal $V_i$ from an input 28 to a complementary logic signal $V_o$ at an output 30. When En is low ($\overline{En}$ high), tri-state Schmitt trigger 22 is disabled to function as a logical inverter, and output 30 of tri-state Schmitt trigger 22 is in a high impedance state, as further described below. First tri-state controller P-FET TP1 is connected in series with P-FET P1 and P-FET P2. P-FET P1 and P-FET P2 are collectively known as a first pair of rail-pulling switching devices, which are capable of providing an electrical connection from output 30 of Schmitt trigger 22 to first voltage rail 24, which is preferably at +2V. While first tri-state controller P-FET TP1 is shown between first voltage rail 24 and the first pair of rail-pulling switching devices, alternatively first tri-state controller P-FET TP1 may be swapped with P-FET P1 or P-FET P2, such that P-FET P1 or P-FET P2 is adjacent first voltage rail 24, while P-FET P1, P-FET P2 and first tri-state controller P-FET TP1 remain connected in series. This swapping still retains the requisite control of selectively connecting output 30 to first voltage rail 24.

A second tri-state controller N-FET TN1 is connected in series with N-FET N1 and N-FET N2, and terminates at a second voltage rail 26, which is at a logically low voltage $V_{SS}$, which preferably is at ground. A third tri-state controller N-FET TN2 is connected between P-FET P3 and second voltage rail 26. The gate of second tri-state controller N-FET TN1 and the gate of third tri-state controller N-FET TN2 are connected via inputs 23a and 23b respectively to enabling signal En, which when logically high permits tri-state Schmitt trigger 22 to function as a Schmitt trigger inverter with hysteresis characteristics for output 30 voltage $V_O$.

A fourth tri-state controller P-FET TP2 is connected between first voltage rail 24 and N-FET N3. N-FET N3 functions as a second threshold adjustment switching device to N-FET N2 and N-FET N1, just as P-FET P3 functions as a first threshold adjustment switching device for P-FET P1 and P-FET P2. The gate of fourth tri-state controller P-FET TP2 is connected via input 21b to signal $\overline{En}$.

Reference is now made to FIG. 4, a table representing the output of tri-state Schmitt trigger 22 for different permutations of $V_i$ being low or high and the enable signal En being high or low. The various switching devices, here N-FETs and P-FETs, are described in their final steady state as being turned on or off. For example, when $V_i$ is low and the enable signal En is high ($\overline{En}$ is low), first tri-state controller P-FET TP1 is ON, P-FET P1 is ON, P-FET P2 is ON, N-FET N2 is OFF and N-FET N1 is OFF, thus output 30 of tri-state Schmitt trigger 22 is a high voltage $V_H$. Further, while all devices are described as being ON or OFF, it is understood that these terms are relative descriptions related to the state level of conduction of the device deeming it as being ON or OFF as readily understood by those skilled in the art of electronic switches and semiconductors.

In another illustrative example shown in FIG. 4, when the enable signal En is low ($\overline{En}$ is high), first tri-state controller P-FET TP1, second tri-state controller N-FET TN1, third tri-state controller N-FET TN2, and fourth tri-state controller P-FET TP2 are all turned off. Thus, there is no connection to either the logically high first voltage rail 24 or the logically low second voltage rail 26. Thus, output 30 of tri-state Schmitt trigger 22 is in a high impedance state, represented in FIG. 4 as $R_{HI}$.

The present invention therefore provides a tri-state Schmitt trigger utilizing a minimal number (10) of switching devices. When the output of tri-state Schmitt trigger 22 is in a high impedance state, all connections to the voltage rails, both high and low, are blocked, and thus there is no current flow or switching activity. Other arrangements of devices in the present invention may also be used. For example, fourth tri-state controller P-FET TP2 and third tri-state controller N-FET TN2 may be swapped along with their respective inputs 21b receiving signal $\overline{En}$ and 23b receiving input En. That is, P-FET TP2 still is controlled by signal $\overline{En}$, and N-FET TN2 is still controlled by enabling signal En, such that P-FET TP2 and N-FET TN2 continue to selectively block any electrical connection to first voltage rail 24 and second voltage rail 26.

Reference is again made to FIG. 2, which has been previously described as the transfer function characteristic curve 12 for the conventional voltage model Schmitt trigger 10. The tri-state controllers described above do not impact on the hysteresis of the inventive tri-state Schmitt trigger 22, and thus transfer function characteristic curve 12 also illustrates the voltage transfer function of Schmitt trigger 22.

While the invention has been particularly shown and described with the reference to a preferred embodiment, it will be understood by those skilled in the art that various changes in form and detail may be made therein without departing from the spirit and scope of the invention.

What is claimed is:

1. A tri-state Schmitt trigger comprising:

a conventional voltage mode Schmitt trigger; and a plurality of tri-state controller switching devices coupled between the conventional voltage mode Schmitt trigger and a first voltage rail and a second voltage rail, wherein an output of the Schmitt trigger transitions to a high impedance state when at least one of the plurality of tri-state controller switching devices is turned off, such that said output of the Schmitt trigger is selectively set to said first voltage rail, said second voltage rail or said high impendence state.

2. The tri-state Schmitt trigger of claim 1, wherein the Schmitt trigger is a Complementary Metal Oxide Semiconductor (CMOS) circuit.

3. The tri-state Schmitt trigger of claim 1, wherein the first voltage rail is a logical high voltage.

4. The tri-state Schmitt trigger of claim 1, wherein the second voltage rail is a logical low voltage.

5. A tri-state Schmitt trigger comprising:

a Schmitt trigger output;

a first plurality of switching devices coupled between the output and a first voltage rail, said first plurality of switching devices including a first tri-state controller switching device;

a second plurality of switching devices coupled between the output and a second voltage rail, said second plurality of switching devices. including a second tri-state controller switching device;

a voltage signal input connected to the first and second plurality of switching devices;

a first threshold adjustment switching device coupled to the output and the first plurality of switching devices;

a second threshold adjustment switching device coupled to the output and the second plurality of switching devices;

a third tri-state controller switching device coupled to the first threshold controller adjustment switching device and the second voltage rail; and a fourth tri-state controller switching device coupled to the second threshold controller adjustment switching device and the first voltage rail, wherein when said third and fourth tri-state controllers are turned off, said Schmitt trigger output is a high impedance.

6. The tri-state Schmitt trigger of claim 5, wherein the first voltage rail is a logically high voltage rail and the second voltage rail is a logically low voltage rail.

7. The tri-state Schmitt trigger of claim 6, further comprising:

the first plurality of switching devices comprising a first pair of rail-pulling switching devices serially coupled with the first tri-state controller switching device between the logically high voltage rail and the Schmitt trigger output; and the second plurality of switching devices comprising a second pair of rail-pulling switching devices serially coupled with the second tri-state controller switching device between the Schmitt trigger output and the logically low voltage rail.

8. The tri-state Schmitt trigger of claim 5, wherein the first plurality of switching devices, the second plurality of switching devices, the first threshold adjustment switching device, the second threshold adjustment switching device, the third tri-state controller switching device and the fourth tri-state controller switching device are transistors.

9. The tri-state Schmitt trigger of claim 8, wherein the transistors are Field Effect Transistors (FET).

10. The tri-state Schmitt trigger of claim 5, wherein the first plurality of switching devices, the first threshold adjustment switching device and the fourth tri-state controller switching device are P-channel FET's (P-FET), and the second plurality of switching devices, the second threshold adjustment switching device and the third tri-state controller switching device are N-channel FET's (N-FET).

11. A method for inverting a logic input signal, said method comprising:

inputting a logic input signal into a Schmitt trigger; and selectively setting to a high impedance state at least one of a plurality of tri-state controller switching devices coupled between the Schmitt trigger and a first voltage rail and a second voltage rail, wherein an output of the Schmitt trigger is in a high impedance state when at least one of the plurality of tri-state controller switching devices is set to a high impedance state, and the output of the Schmitt trigger is a complementary logic signal to the logic input signal when at least one of the plurality of tri-state controller switching devices is set to a low impedance state.

* * * * *